United States Patent
Abdel Ghany et al.

(10) Patent No.: US 9,130,529 B2
(45) Date of Patent: Sep. 8, 2015

(54) AREA-EFFICIENT DEGENERATIVE INDUCTANCE FOR A LOW NOISE AMPLIFIER (LNA)

(71) Applicant: QUALCOMM Incorporated, San Diego, CA (US)

(72) Inventors: Ehab Ahmed Sobhy Abdel Ghany, San Diego, CA (US); Sang Hyun Woo, San Diego, CA (US); Wingching Vincent Leung, San Diego, CA (US); Zhang Jin, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/157,553

(22) Filed: Jan. 17, 2014

(65) Prior Publication Data
US 2015/0207482 A1    Jul. 23, 2015

(51) Int. Cl.
| | |
|---|---|
| *H04B 1/18* | (2006.01) |
| *H04B 1/10* | (2006.01) |
| *H03G 3/30* | (2006.01) |
| *H03F 3/19* | (2006.01) |
| *H03F 1/26* | (2006.01) |
| *H03F 3/193* | (2006.01) |
| *H03F 3/68* | (2006.01) |

(52) U.S. Cl.
CPC .............. *H03G 3/3036* (2013.01); *H03F 1/26* (2013.01); *H03F 3/19* (2013.01); *H03F 3/193* (2013.01); *H03F 3/68* (2013.01); *H03F 2200/294* (2013.01); *H03F 2200/372* (2013.01); *H03F 2200/451* (2013.01)

(58) Field of Classification Search
USPC ................ 455/132, 283, 292, 293, 296, 311; 330/149
See application file for complete search history.

(56) References Cited

U.S. PATENT DOCUMENTS

| | | | |
|---|---|---|---|
| 6,509,799 | B1 | 1/2003 | Franca-Neto |
| 6,586,996 | B2 | 7/2003 | Fanous et al. |
| 7,877,077 | B2 | 1/2011 | Mun et al. |
| 8,175,566 | B2 | 5/2012 | Tasic et al. |
| 2004/0066236 | A1 | 4/2004 | Fujimoto et al. |
| 2011/0068871 | A1 | 3/2011 | Fujimoto |
| 2013/0043946 | A1 | 2/2013 | Hadjichristos et al. |
| 2014/0348274 | A1* | 11/2014 | Youssef et al. ................ 375/345 |

OTHER PUBLICATIONS

International Search Report and Written Opinion—PCT/US2015/011283—ISA/EPO—May 8, 2015.

* cited by examiner

*Primary Examiner* — Nguyen Vo
(74) *Attorney, Agent, or Firm* — Smith Risley Tempel Santos LLC

(57) ABSTRACT

A device includes a first and a second low noise amplifier (LNA), a first degenerative inductance coupled between the first LNA and ground by a first ground connection, and a second degenerative inductance coupled between the second LNA and ground by a second ground connection, the first and second degenerative inductances configured to establish negative inductive coupling between the first and second degenerative inductances.

20 Claims, 9 Drawing Sheets

US 9,130,529 B2

AREA-EFFICIENT DEGENERATIVE INDUCTANCE FOR A LOW NOISE AMPLIFIER (LNA)

BACKGROUND

1. Field

The present disclosure relates generally to electronics, and more specifically to transmitters and receivers.

2. Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In some instances, it is desirable to have a single transmitter or receiver that is configured to operate using multiple transmit frequencies and/or multiple receive frequencies. For a receiver to be able to simultaneously receive two or more receive signals, the concurrent operation of two or more receive paths is generally required. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate carrier signals that occur in the same communication band. Inter-band carrier aggregation refers to the processing of two separate carrier signals that occur in different communication bands.

A prior receiver architecture uses multiple LNAs to support the simultaneous downlink channels. This architecture shorts the LNA inputs together to reduce the number of radio frequency (RF) connections used to interface with a transceiver. These prior LNAs can operate both stand-alone and simultaneously. Stand-alone operation refers to operating on a single carrier signal at a time; and simultaneous operation refers to operating on two or more carrier signals simultaneously. The outputs of these LNAs are separated to provide isolation between the different downlink channels. Usually these LNAs exhibit a degraded noise figure (NF) when simultaneously operating on multiple carriers as compared to when operating independently on a single carrier due to degradation of input matching and/or noise coupling between different signal paths when simultaneously operating on multiple carriers. In an effort to reduce circuit architecture size and reduce the number of ground connections, ground routings from the inductances of the LNAs to ground pins on the circuit become long, thus reducing LNA performance due to increased inductive coupling between different RF ground paths.

It would be desirable to reduce inductive coupling between different RF ground paths and improve receiver noise figure performance for a low nose amplifier architecture.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
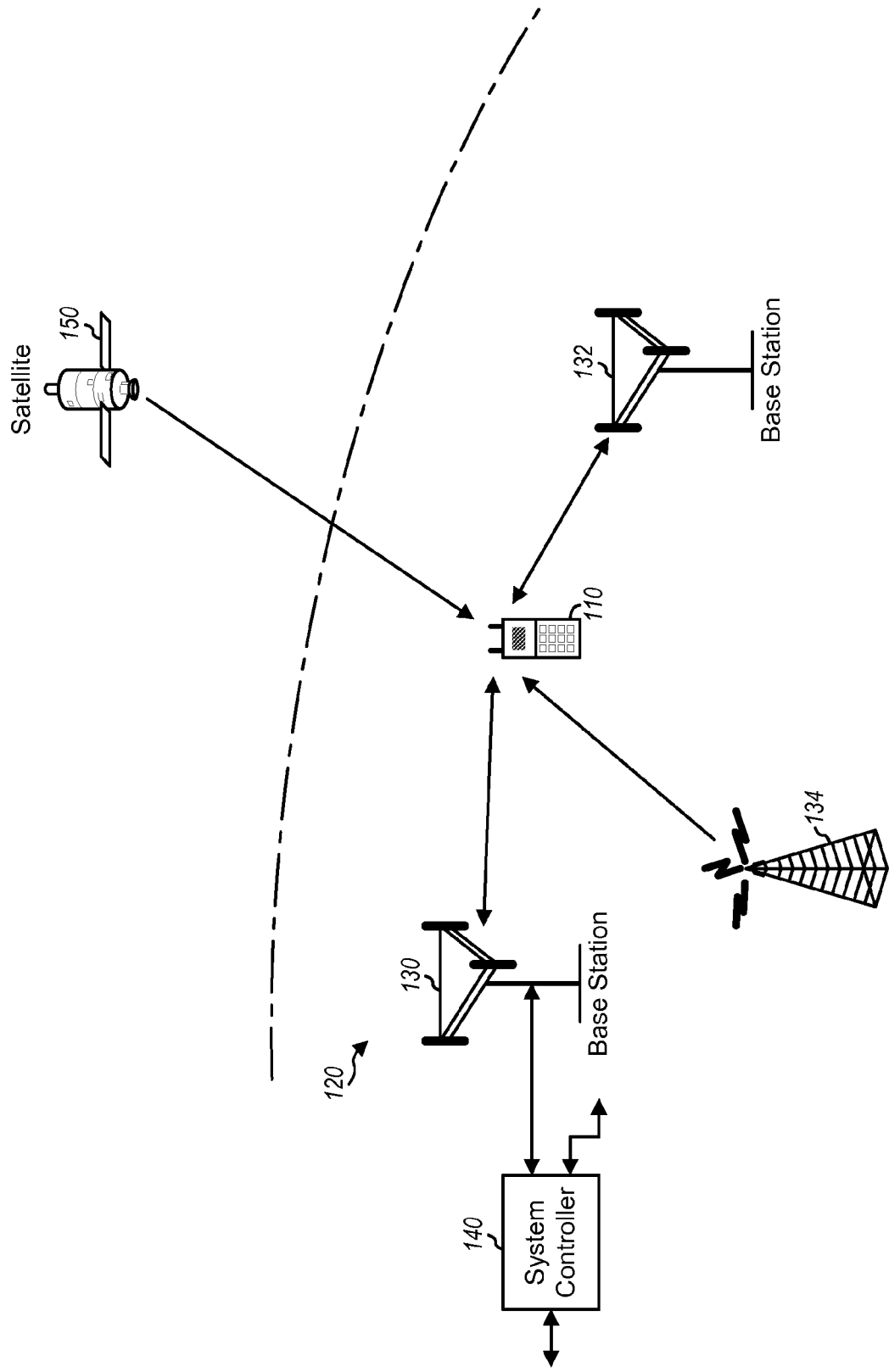
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used herein, the term "stand-alone operation" refers to a low noise amplifier (LNA) operating on a single carrier signal at a time; and the term "simultaneous operation" refers to an LNA operating on two or more carrier signals simultaneously.

In an exemplary embodiment, the area-efficient degenerative inductance for a low noise amplifier (LNA) relates to an architecture for implementing degenerative inductance for noise cancellation in an LNA to improve the receiver noise figure (NF) for both Intra-CA and Inter-CA operation.

Exemplary embodiments of the disclosure are directed toward an area-efficient degenerative inductance for an LNA that provides a switchless 4-port structure that combines negatively coupled (−K) degenerative inductances that can compensate for positive inductive (+K) coupling between conductors on an integrated circuit. In an exemplary embodiment, the negatively coupled (−K) degenerative inductances can be interwoven, concentric, or combinations thereof or otherwise fabricated to efficiently use available space on an integrated circuit, while also compensating for the positive inductive (+K) coupling created by separate ground routing connections for each degenerative inductance for each LNA.

In an exemplary embodiment, the negatively coupled (−K) degenerative inductances can compensate for noise transferred between positively inductively (+K) coupled ground routing connections associated with each degenerative inductance for each LNA in a multiple LNA architecture. The negative inductive (−K) coupling created by the degenerative inductances offsets the effects of any positive inductive (+K) coupling between the separate ground routing connections (or other connections) for each degenerative inductance for each LNA as given by: $L\_degen * K\_degen = -L\_ground * K\_ground$, where "L" is inductance and "K" is a coupling factor.

Exemplary embodiments of the area-efficient degenerative inductance for an LNA can be implemented using a switchless 4-port structure that improves the noise figure (NF) of the multiple LNAs in the presence of the positive inductive (+K) coupling between the separate ground routing connections, or other connections that may generate a positive inductive (+K) coupling factor. The design is area efficient and overcomes many challenges that may arise due to positive inductive (+K) coupling between the ground routings or other connections.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
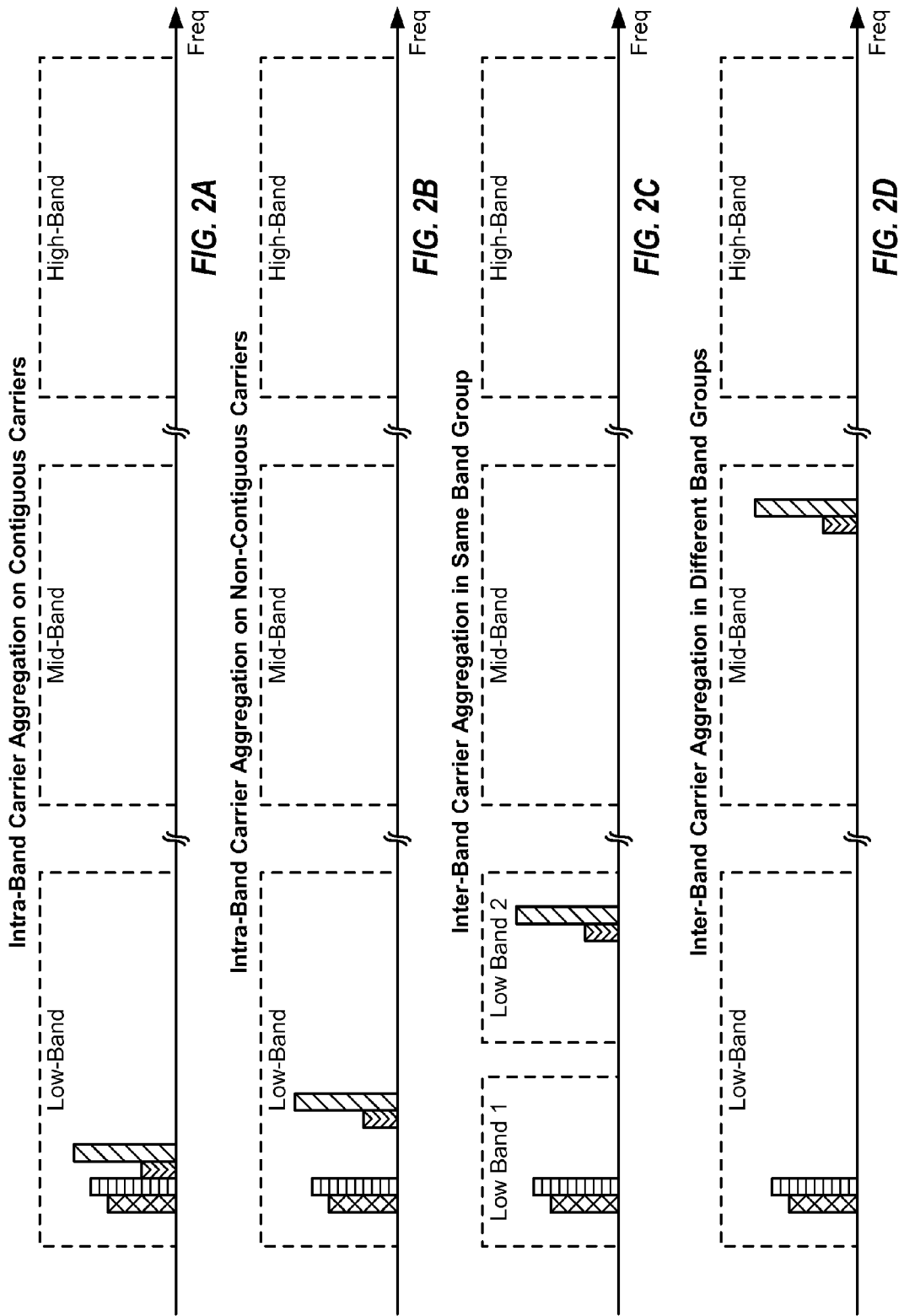
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
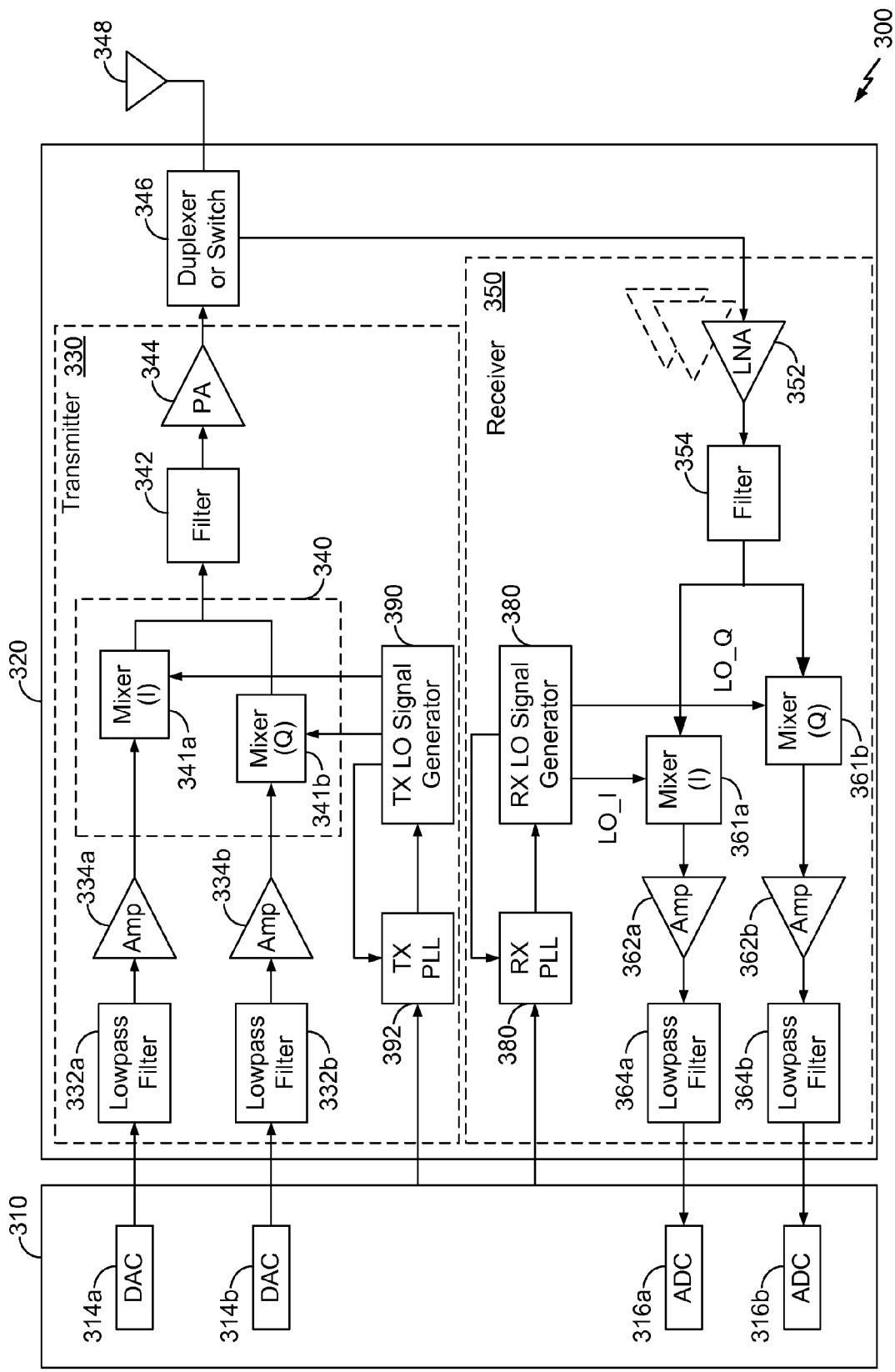
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314*a* and 314*b* for converting digital signals generated by the data processor 310 into the I and Q analog output signals, e.g., I and Q output currents, for further processing.

Within the transmitter 330, lowpass filters 332*a* and 332*b* filter the I and Q analog transmit signals, respectively, to remove undesired images caused by the prior digital-to-analog conversion. Amplifiers (Amp) 334*a* and 334*b* amplify the signals from lowpass filters 332*a* and 332*b*, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The LNA 352 may comprise a single LNA configured to operate on one or more carrier signals, either stand-alone or simultaneously, or may comprise two or more LNAs configured to operate on one or more carrier signals, either stand-alone or simultaneously. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361*a* and 361*b* mix the output of filter 354 with I and Q receive (RX) LO signals (i.e., LO_I and LO_Q) from an RX LO signal generator 380 to generate I and Q baseband signals. The I and Q baseband signals are amplified by amplifiers 362*a* and 362*b* and further filtered by lowpass filters 364*a* and 364*b* to obtain I and Q analog input signals, which are provided to data processor 310. In the exemplary embodiment shown, the data processor 310 includes analog-to-digital-converters (ADC's) 316*a* and 316*b* for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

In a CA communication environment where multiple receive signals are processed simultaneously, it is possible that coupling between source-degenerative inductances in the LNA may degrade the noise figure (NF) of the receiver, particularly when the LNA may be operating on two or more carrier signals simultaneously. This undesirable coupling can lead to desensitization of the receiver, ultimately leading to a degraded noise figure (NF) of the receiver.

In an exemplary embodiment of the present disclosure, a negative (−K) coupling between two or more degenerative inductances is created to compensate for any positive (+K) coupling between the L-degenerative inductances and the ground routings or other connections.

Figure 4:
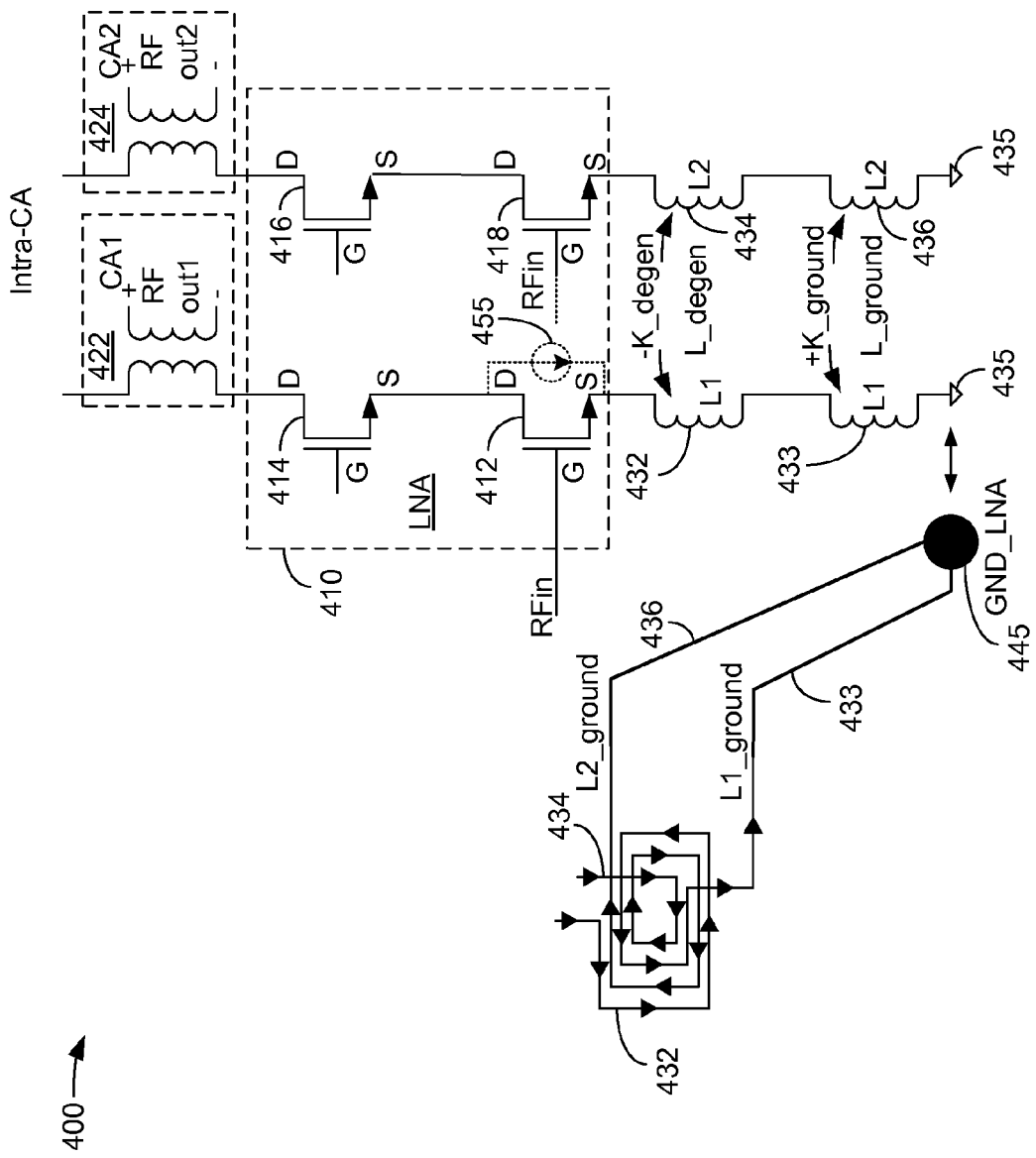
FIG. 4 is a schematic diagram illustrating an exemplary embodiment of an area-efficient degenerative inductance for a low noise amplifier (LNA).

FIG. 4 is a schematic diagram illustrating an exemplary embodiment of an area-efficient degenerative inductance for a low noise amplifier (LNA). The circuit 400 comprises an exemplary embodiment of a low noise amplifier (LNA) 410, operatively coupled to load circuit 422 and load circuit 424. In this exemplary embodiment, the LNA 410 comprises two amplification paths configured to operate on a carrier signal, RFin, having two different carrier frequencies in an intraband CA arrangement. The LNA 410 comprises a first gain stage 412 and a first cascode device 414, a second gain stage 418 and a second cascode device 416. The first and second gain stages 412 and 418 receive the RF in signal on their respective gate terminals. The gate of each cascode device 414 and 416 can be coupled to an appropriate bias voltage signal, and the source of each cascode device 414 and 416 can be coupled to the drains of the gain stages 412 and 418, respectively. The drain of each cascode device 414 and 416 can be connected to a load circuit 422 and 424, respectively. In this exemplary embodiment, the load circuit 422 and the load circuit 424 are illustrated in a single-ended to differential architecture with the load circuit 422 providing a differential output RFout1 and the load circuit 424 providing a differential output RFout2, with RFout1 corresponding to a first carrier signal, CA1, and RFout2 corresponding to a second carrier signal, CA2.

Although illustrated as comprising field effect transistor (FET) technology, the LNA 410 may comprise other switching technology, such as, for example only, bi-polar junction transistor (BJT) technology, or other switching technology. Moreover, although the LNA 410 is illustrated as having two amplification paths, the area-efficient degenerative inductance for a low noise amplifier (LNA) can be used with more or fewer amplification paths.

The source of the first gain stage 412 is coupled to a first side of a source degeneration inductance 432, referred to as L1_degen. The second side of the source degeneration inductance 432 is coupled to a ground node 435, with the ground connection illustrated as a ground inductance 433, referred to as L1_ground.

Similarly, the source of the second gain stage 418 is coupled to a first side of a source degeneration inductance 434, referred to as L2_degen. The second side of the source degeneration inductance 434 is coupled to the ground node 435, with the ground connection illustrated as a ground inductance 436, referred to as L2_ground. The ground inductance 433 and the ground inductance 436 are illustrated as inductances because the ground routing connections between the source degeneration inductances 432 and 434 and the ground node 445 can be sufficiently long and sufficiently close such that their inductive effects are considered when determining the noise performance of the LNA 410.

The source degeneration inductances 432 and 434 provide inductive source degeneration to the first gain stage 412 and the second gain stage 418, respectively. Inductive source degeneration utilizes an inductor coupled to the source of a transistor to cause the current flow to lag behind the voltage applied to the gate of the transistor. This provides control over the real part of the input impedance appearing at the input gate of the transistor/amplifier.

The coupling between the ground inductance 433 and the ground inductance 436 is referred to as "+K_ground" to illustrate that the inductive coupling between the ground inductance 433 and the ground inductance 436 creates an undesirable positive inductive (+K) coupling factor, which can lead to a decreased noise figure for the LNA 410 under some operating conditions.

The coupling between the source degeneration inductance 432 and the source degeneration inductance 434 is referred to as "−K_degen" to illustrate that the inductive coupling between the source degeneration inductance 432 and the source degeneration inductance 434 creates a negative (−K) coupling factor, which can counter the effects of the undesirable positive inductive (+K) coupling between the ground inductance 433 and the ground inductance 436.

To optimize the effects of counteracting the undesirable positive coupling between the ground inductance 433 and the ground inductance 436, it is desirable that L_degen*K_degen=−L_ground*K_ground.

The source degeneration inductance 432 and the source degeneration inductance 434 are also illustrated graphically as being wound and connected in such a way that the current flow through the source degeneration inductance 432 is opposite the direction of the current flow through the source degeneration inductance 434. The source degeneration inductance 432 and the source degeneration inductance 434 are also illustrated graphically as being interwoven so that the area occupied by both of the source degeneration inductance 432 and the source degeneration inductance 434 is substantially no larger than the amount of area occupied by one of the source degeneration inductances. In an exemplary embodiment, the winding of the source degeneration inductance 432 with respect to the source degeneration inductance 434 allows the source degeneration inductance 432 and the source degeneration inductance 434 to be configured so that they produce current flow in opposing directions, thus providing the negative inductive (−K) coupling between the source degeneration inductance 432 and the source degeneration inductance 434.

The ground inductance 433 and the ground inductance 436 are also illustrated as circuit trace conductors that both connect to the ground pin 445. The current in the ground inductance 433 flows in the same direction as the current in the ground inductance 436 providing the positive inductive (+K) coupling between the ground inductance 433 and the ground inductance 436. In this manner, the negative inductive (−K) coupling between the source degeneration inductance 432 and the source degeneration inductance 434 offsets the positive inductive (+K) coupling between the ground inductance 433 and the ground inductance 436, thus allowing each source degeneration inductance 432 and 434 to be independently connected to the ground pin 445 by a respective independent ground inductance 433 and ground inductance 436. Independently connecting each source degeneration inductance 432 and 434 to the ground pin 445 by a respective independent ground inductance 433 and ground inductance 436 improves the noise figure of the LNA 410.

The generally concentric architecture of the source degeneration inductance 432 and the source degeneration inductance 434 also reduces the amount of area occupied by the two source degeneration inductances in that the overall area consumed by the source degeneration inductance 432 and the source degeneration inductance 434 shown in FIG. 4 is smaller than providing the source degeneration inductance 432 and the source degeneration inductance 434 as separate structures that occupy entirely independent areas.

In an exemplary embodiment, a noise current is illustrated using reference numeral 455 as being generated by the first gain stage 412, which can appear at the output of the second load circuit 424 as noise on the carrier RFout2 as a result of the noise being coupled to the source degeneration inductance 434 through the positive inductive (+K) coupling between the ground inductance 433 and ground inductance 436.

In this exemplary embodiment, the negative inductive (−K) coupling between the source degeneration inductance 432 and the source degeneration inductance 434 can cancel the noise generated by the first gain stage 412 and prevent the noise from appearing at the output of the second load circuit 424 as noise on the carrier RFout2 because the negative inductive (−K) coupling between the source degeneration inductance 432 and the source degeneration inductance 434 compensates for the positive inductive (+K) coupling between the ground inductance 433 and ground inductance 436 and compensates for the inductive coupling of the noise current from the ground inductance 433 to the ground inductance 436. Similarly, the negative inductive (−K) coupling between the source degeneration inductance 432 and the source degeneration inductance 434 can cancel any noise generated by the second gain stage 418 and prevent the noise from appearing at the output of the first load circuit 422 as noise on the carrier RFout1.

Figure 5:
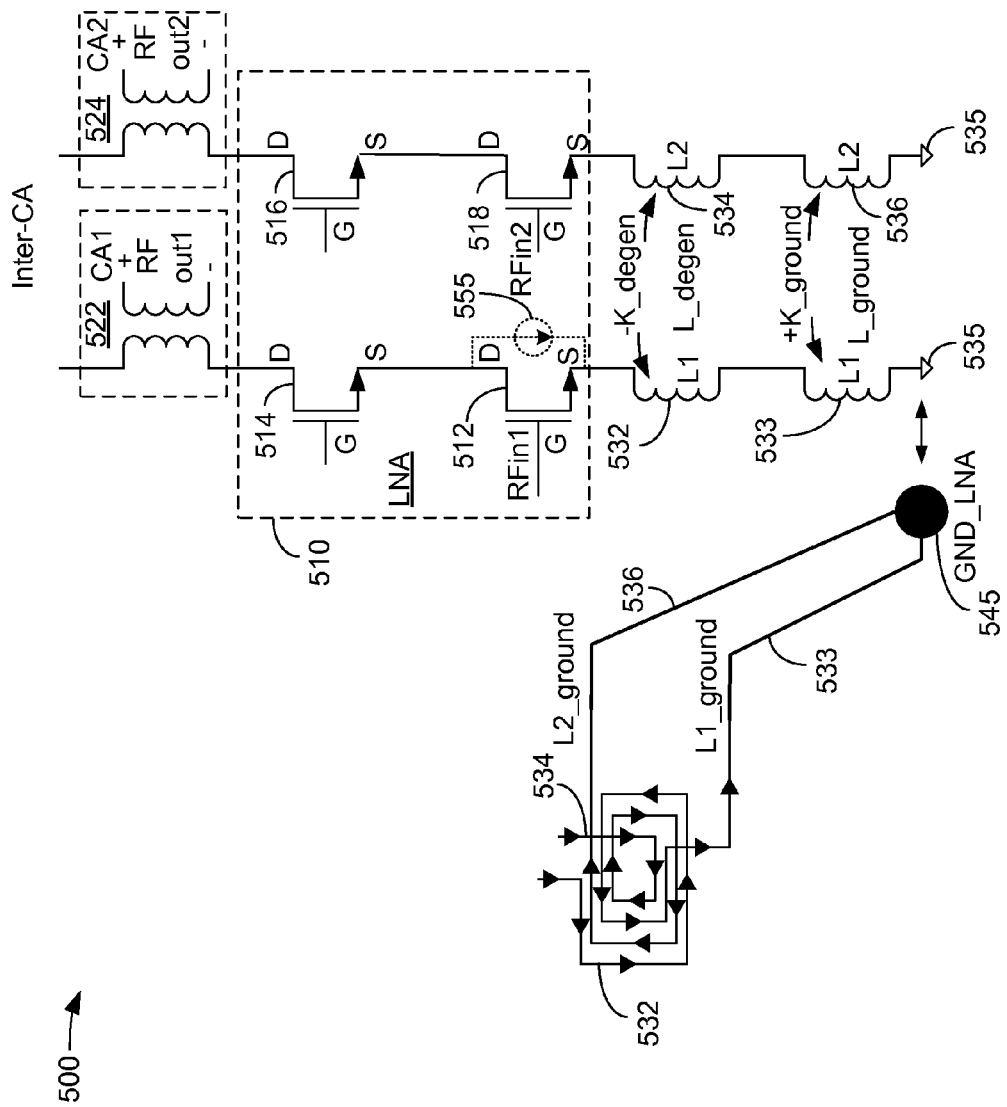
FIG. 5 is a schematic diagram illustrating an alternative exemplary embodiment of an area-efficient degenerative inductance for a low noise amplifier (LNA).

FIG. 5 is a schematic diagram illustrating an alternative exemplary embodiment of an area-efficient degenerative inductance for a low noise amplifier (LNA). The circuit 500 shows an exemplary embodiment of an area-efficient degenerative inductance for a low noise amplifier (LNA) that is applicable to an inter-band CA arrangement.

The circuit 500 comprises an exemplary embodiment of a low noise amplifier (LNA) 510, operatively coupled to load circuit 522 and load circuit 524. In this exemplary embodiment, the LNA 510 comprises two amplification paths configured to operate on two carrier signals, RFin1 and RFin2, in an inter-band CA arrangement. The LNA 510 comprises a first gain stage 512 and a first cascode device 514, a second gain stage 518 and a second cascode device 516. The first and second gain stages 512 and 518 receive RF input signals RFin1 and RFin2 on their respective gate terminals. The gate of each cascode device 514 and 516 can be coupled to an appropriate bias voltage signal, and the source of each cascode device 514 and 516 can be coupled to the drain of the gain stages 512 and 518, respectively. The drain of each cascode device 514 and 516 can be supplied to a load circuit 522 and 524, respectively. In this exemplary embodiment, the load circuit 522 and the load circuit 524 are illustrated in a single-ended to differential architecture with the load circuit 522 providing a differential output RFout1 and the load circuit 524 providing a differential output RFout2, with RFout1 corresponding to the first carrier signal RFin1 and the output signal RFout2 corresponding to the second carrier input signal RFin2.

Although illustrated as comprising field effect transistor (FET) technology, the LNA 510 may comprise other switching technology, such as, for example only, bi-polar junction transistor (BJT) technology, or other switching technology. Moreover, although the LNA 510 is illustrated as having two amplification paths, the apparatus and method for an area-efficient degenerative inductance for a low noise amplifier (LNA) can be used with more or fewer amplification paths.

The source of the first gain stage 512 is coupled to a first side of a source degeneration inductance 532, referred to as L1_degen. The second side of the source degeneration inductance 532 is coupled to a ground node 535, with the ground connection illustrated as a ground inductance 533, referred to as L1_ground.

Similarly, the source of the second gain stage 518 is coupled to a first side of a source degeneration inductance 534, referred to as L2_degen. The second side of the source degeneration inductance 534 is coupled to the ground node 535, with the ground connection illustrated as a ground inductance 536, referred to as L2_ground. The ground inductance 533 and the ground inductance 536 are illustrated as inductances because the ground connections between the source degeneration inductances 532 and 534 and the ground node 545 can be sufficiently long and sufficiently close such that their inductive effect is considered when determining the noise performance of the LNA 510.

The source degeneration inductances 532 and 534 provide inductive source degeneration to the first gain stage 512 and the second gain stage 518, respectively. Inductive source degeneration utilizes an inductor coupled to the source terminal of a transistor to cause the current flow to lag behind the voltage applied to the gate terminal of the transistor. This provides control over the real part of the input impedance appearing at the input gate of the transistor/amplifier.

The coupling between the ground inductance 533 and the ground inductance 536 is referred to as "+K_ground" to illustrate that the coupling between the ground inductance 533 and the ground inductance 536 creates an undesirable positive inductive coupling factor, which can lead to a decreased noise figure for the LNA 510 under some operating conditions.

The coupling between the source degeneration inductance 532 and the source degeneration inductance 534 is referred to as "−K_degen" to illustrate that the inductive coupling between the source degeneration inductance 532 and the source degeneration inductance 534 creates a negative coupling factor, which can counter the effects of the undesirable positive inductive coupling between the ground inductance 533 and the ground inductance 536.

To optimize the effects of counteracting the undesirable positive inductive coupling between the ground inductance 533 and the ground inductance 536, it is desirable that L_degen*K_degen=−L_ground*K_ground.

The source degeneration inductance 532 and the source degeneration inductance 534 are also illustrated graphically as being wound and connected in such a way that the current flow through the source degeneration inductance 532 is opposite the direction of the current flow through the source degeneration inductance 534. The source degeneration inductance 532 and the source degeneration inductance 534 are also illustrated graphically as being interwoven so that the area occupied by both the source degeneration inductance 532 and the source degeneration inductance 534 is substantially no larger than the amount of area occupied by one of the source degeneration inductances. In an exemplary embodiment, the winding of the source degeneration inductance 532 with respect to the source degeneration inductance 534 allows the source degeneration inductance 532 and the source degeneration inductance 534 to be configured so that they produce current flow in opposing directions, thus providing the negative inductive (−K) coupling between the source degeneration inductance 532 and the source degeneration inductance 534.

The ground inductance 533 and the ground inductance 536 are also illustrated as circuit trace conductors that both connect to the ground pin 545. The current in the ground inductance 533 flows in the same direction as the current in the ground inductance 536 providing the positive inductive (+K) coupling between the ground inductance 533 and the ground inductance 536. In this manner, the negative inductive (−K) coupling between the source degeneration inductance 532 and the source degeneration inductance 534 offsets the positive inductive (+K) coupling between the ground inductance 533 and the ground inductance 536, thus allowing each source degeneration inductance 532 and 534 to be independently connected to the ground pin 545 by a respective independent ground inductance 533 and ground inductance 536. Independently connecting each source degeneration inductance 532 and 534 to the ground pin 545 by a respective independent ground inductance 533 and ground inductance 536 improves the noise figure of the LNA 510.

The generally concentric architecture of the source degeneration inductance 532 and the source degeneration inductance 534 also reduces the amount of area occupied by the two source degeneration inductances in that the overall area consumed by the source degeneration inductance 532 and the source degeneration inductance 534 shown in FIG. 5 is smaller than providing the source degeneration inductance 532 and the source degeneration inductance 534 as separate structures that occupy entirely independent different areas.

In an exemplary embodiment, a noise current is illustrated using reference numeral 555 as being generated by the first gain stage 512, which can appear at the output of the second load circuit 524 as noise on the carrier RFout2 as a result of the noise being coupled to the source degeneration inductance 534 through the positive inductive (+K) coupling between the ground inductance 533 and ground inductance 536.

In this exemplary embodiment, the negative inductive (−K) coupling between the source degeneration inductance 532 and the source degeneration inductance 534 can cancel the noise generated by the first gain stage 512 and prevent the noise from appearing at the output of the second load circuit 524 as noise on the carrier RFout2 because the negative inductive (−K) coupling between the source degeneration inductance 532 and the source degeneration inductance 534 compensates for the positive inductive (+K) coupling between the ground inductance 533 and ground inductance 536 and compensates for the inductive coupling of the noise current from the ground inductance 533 to the ground inductance 536. Similarly, the negative inductive (−K) coupling between the source degeneration inductance 532 and the source degeneration inductance 534 can cancel any noise generated by the second gain stage 518 and prevent the noise from appearing at the output of the first load circuit 522 as noise on the carrier RFout1.

Figure 6:
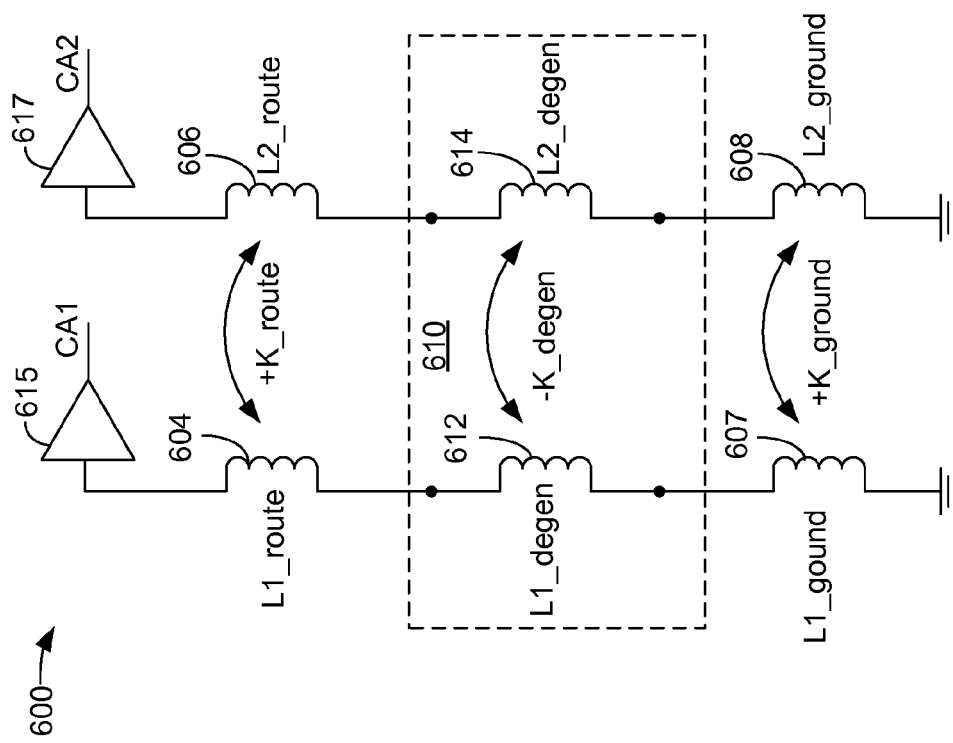
FIG. 6 is a schematic diagram illustrating an exemplary embodiment of an area-efficient degenerative inductance for a low noise amplifier (LNA).

FIG. 6 is a schematic diagram 600 illustrating an exemplary embodiment of an area-efficient degenerative inductance for a low noise amplifier (LNA). FIG. 6 shows a four (4) port switchless inductive network 610 comprising an inductive structure having a first source degeneration inductance (L1_degen) 612 and a second source degeneration inductance (L2_degen) 614. The first source degeneration inductance 612 and the second source degeneration inductance 614 are arranged such that a negative inductive (−K) coupling (−K_degen) is created between the first source degeneration inductance 612 and the second source degeneration inductance 614.

The schematic diagram 600 also illustrates exemplary inductive coupling of a first LNA circuit 615 and a second LNA circuit 617. The active components of the first LNA circuit 615 and the second LNA circuit 617 are not shown in FIG. 6 for clarity, with the inductive coupling between a first gain stage (not shown) and the first source degeneration inductance 612 shown using a first routing inductance (L1_route) 604; and the inductive coupling between a second gain stage (not shown) and the second source degeneration inductance 614 shown using a second routing inductance (L2_route) 606.

The first routing inductance 604 represents a circuit routing associated with the first LNA circuit 615, which couples a source of the first gain stage (not shown) to the inductive network 610, and a first ground inductance 607 represents a ground routing associated with the first LNA circuit 615, illustrated as an inductive connection (L1_ground), coupling the inductive network 610 to ground.

The second routing inductance 606 represents a circuit routing associated with the second LNA circuit 617, which couples a source of the second gain stage (not shown) to the inductive network 610, and a second ground inductance 608 represents a ground routing associated with the second LNA circuit 617, illustrated as an inductive connection (L2_ground), coupling the inductive network 610 to ground.

In this exemplary embodiment, the coupling between the first routing inductance 604 and the second routing inductance 606 is illustrated as a positive inductive (+K) coupling (+K_route) and the coupling between the inductance 607 and the inductance 608 is illustrated as a positive inductive (+K) coupling (+K_ground). In accordance with an exemplary embodiment of the area-efficient degenerative inductance for a low noise amplifier (LNA), the four (4) port switchless inductive network 610 provides negative inductive (−K) coupling between the first source degeneration inductance 612 and the second source degeneration inductance 614, referred to as "−K_degen" to illustrate that the coupling between the first source degeneration inductance 612 and the second source degeneration inductance 614 creates a negative inductive coupling factor, which can counter the effects of the undesirable positive inductive coupling between the first routing inductance 604 and the second routing inductance 606, and between the first ground inductance 607 and the second ground inductance 608.

Figure 7:
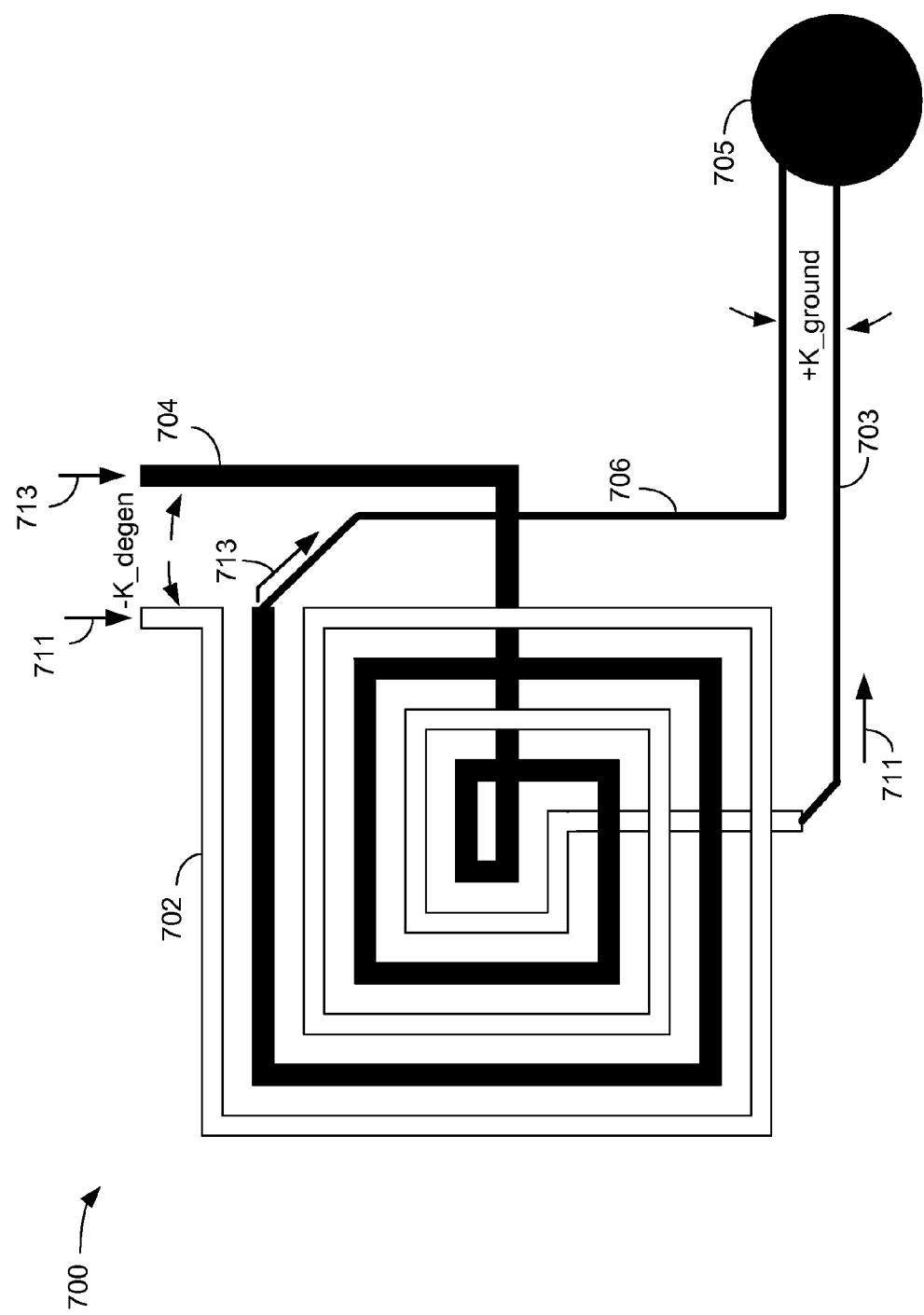
FIG. 7 is a graphical diagram showing a first exemplary embodiment of negatively coupled source degeneration inductances.

FIG. 7 is a graphical diagram 700 showing a first exemplary embodiment of negative inductively (−K) coupled source degeneration inductances. The diagram 700 comprises a first source degeneration inductance 702 and a second source degeneration inductance 704. The first source degeneration inductance 702 is coupled to a ground node 705 through a ground connection 703. The second source degeneration inductance 704 is coupled to the ground node 705 through a ground connection 706. In an exemplary embodiment, the source degeneration inductances 702 and 704 are concentrically wound and have a substantially similar center point. In this exemplary embodiment, the first source degeneration inductance 702 is coupled so that the current flow occurs in a counterclockwise direction from the outer periphery to the center and the second source degeneration inductance 704 is coupled so that the current flow occurs in a clockwise direction from the center to an outer periphery. However, in other exemplary embodiments, the current flow through the first source degeneration inductance 702 can occur in a clockwise direction and the current flow through the second source degeneration inductance 704 can occur in a counterclockwise direction.

In an exemplary embodiment, the first source degeneration inductance 702 and the second source degeneration inductance 704 are interwoven in that portions of the first source degeneration inductance 702 and portions of the second source degeneration inductance 704 alternate from a central point outward. The current flow direction through the first source degeneration inductance 702 is illustrated using arrows 711 and the current flow direction through the second source degeneration inductance 704 is illustrated using the arrows 713. This opposite current flow direction provides the negative inductive (−K) coupling between the first source degeneration inductance 702 and the second source degeneration inductance 704.

The coupling between the first source degeneration inductance 702 and the second source degeneration inductance 704 is referred to as "−K_degen" to illustrate that the coupling between the first source degeneration inductance 702 and the second source degeneration inductance 704 creates a negative inductive coupling factor, which can counter the effects of the undesirable positive inductive coupling, +K_ground, generated between the ground connection 703 and the ground connection 706.

The generally concentric architecture of the first source degeneration inductance 702 and the second source degeneration inductance 704 also minimizes the amount of area occupied by the two source degeneration inductances in that the overall area consumed by the first source degeneration inductance 702 and the second source degeneration inductance 704 shown in FIG. 7 is smaller than it would be if the first source degeneration inductance 702 and the second source degeneration inductance 704 were implemented as separate structures that occupy entirely independent different areas.

Although shown as having a generally square or rectangular shape, the first source degeneration inductance 702 and the second source degeneration inductance 704 can have other shapes, such as for example only, round, polygon, triangular, or other shapes depending on application.

Figure 8:
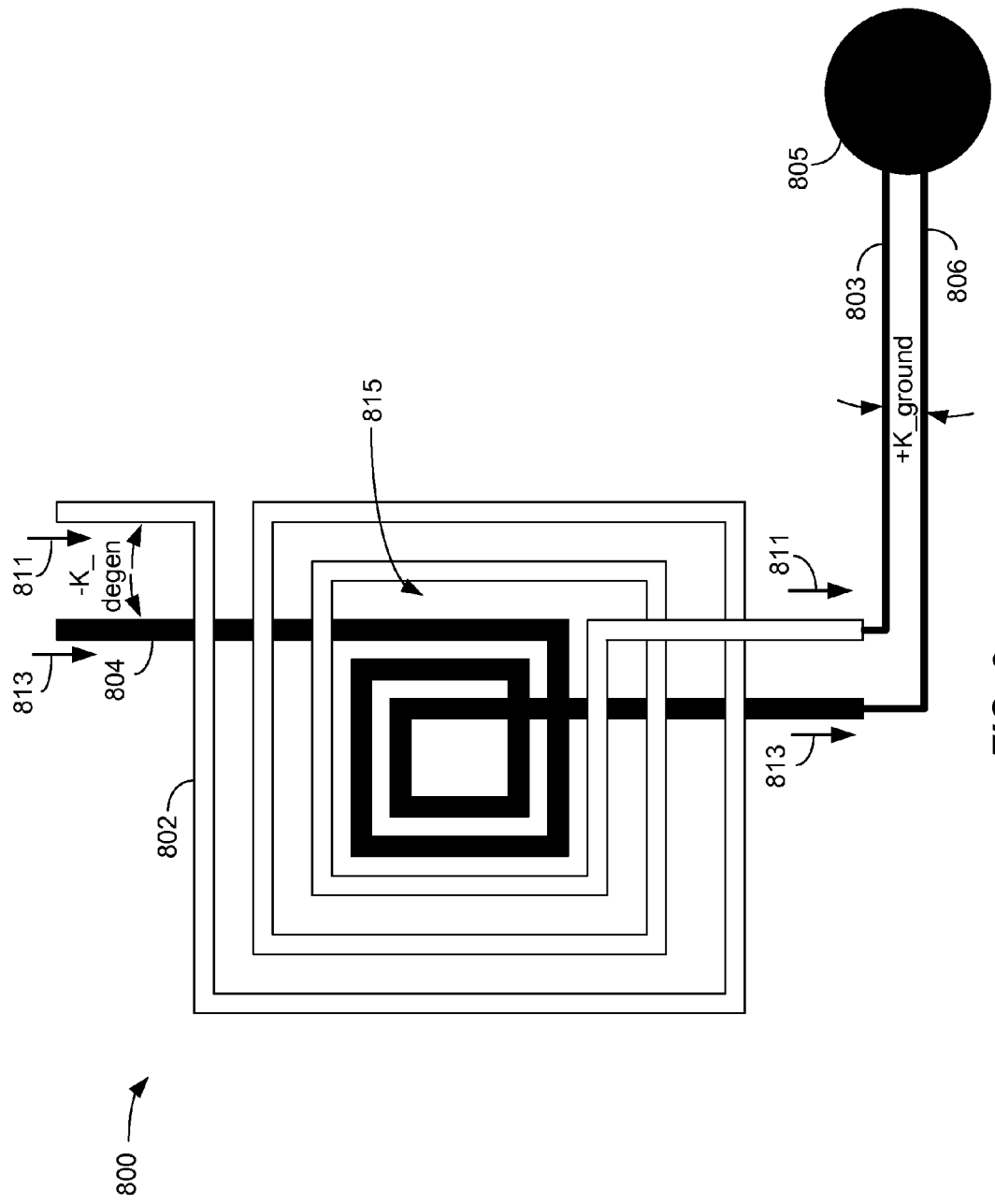
FIG. 8 is a graphical diagram showing a second exemplary embodiment of negatively coupled source degeneration inductances.

FIG. 8 is a graphical diagram showing a second exemplary embodiment of negatively coupled source degeneration inductances. The diagram 800 comprises a first source degeneration inductance 802 and a second source degeneration inductance 804. The first source degeneration inductance 802 is coupled to a ground node 805 through a ground connection 803. The second source degeneration inductance 804 is coupled to the ground node 805 through a ground connection 806. In an exemplary embodiment, the source degeneration inductances 802 and 804 are generally concentrically wound and have a substantially similar center point. In this exemplary embodiment, the first source degeneration inductance 802 is coupled so that the current flow occurs in a counterclockwise direction and the second source degeneration inductance 804 is coupled so that the current flow occurs in a clockwise direction. However, in other exemplary embodiments, the current flow through the first source degeneration inductance 802 can occur in a clockwise direction and the current flow through the second source degeneration inductance 804 can occur in a counterclockwise direction. In an exemplary embodiment, the first source degeneration inductance 802 and the second source degeneration inductance 804 are arranged such that the second source degeneration inductance 804 is located substantially within a central region 815 of the first source degeneration inductance 802, and is substantially contained within the central region 815. The current flow direction through the first source degeneration inductance 802 is illustrated using arrows 811 and the current flow direction through the second source degeneration inductance 804 is illustrated using the arrows 813. This opposite current flow direction provides the negative inductive (−K) coupling between the first source degeneration inductance 802 and the second source degeneration inductance 804.

The coupling between the first source degeneration inductance 802 and the second source degeneration inductance 804 is referred to as "−K_degen" to illustrate that the coupling between the first source degeneration inductance 802 and the second source degeneration inductance 804 creates a negative coupling factor, which can counter the effects of the undesirable positive coupling, +K_ground, generated between the ground connection 803 and the ground connection 806.

The generally concentric architecture of the first source degeneration inductance 802 and the second source degeneration inductance 804 also minimizes the amount of area occupied by the two source degeneration inductances in that the overall area consumed by the first source degeneration inductance 802 and the second source degeneration inductance 804 shown in FIG. 8 is smaller than providing the first source degeneration inductance 802 and the second source degeneration inductance 804 as separate structures that occupy entirely independent different areas.

Although shown as having a generally square or rectangular shape, the first source degeneration inductance 802 and the second source degeneration inductance 804 can have other shapes, such as for example only, round, polygon, triangular, or other shapes depending on application.

Figure 9:
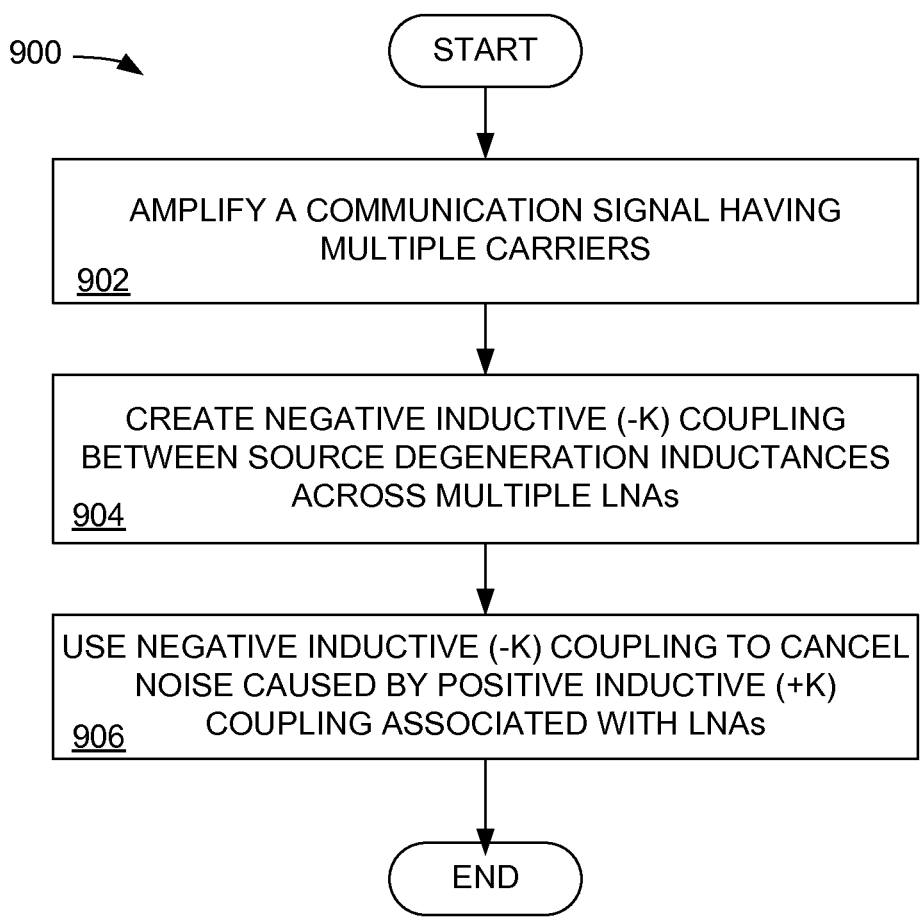
FIG. 9 is a flow chart describing an exemplary embodiment of a method for implementing an area-efficient degenerative inductance for a low noise amplifier (LNA).

FIG. 9 is a flow chart describing an exemplary embodiment of a method for implementing an area-efficient degenerative inductance for a low noise amplifier (LNA).

In block 902, a communication signal having multiple carriers is amplified by multiple low noise amplifiers (LNAs). In an exemplary embodiment, two carrier signals can be amplified by two LNAs.

In block 904, source degenerative inductances associated with the LNAs are coupled together so as to establish a negative inductive (−K) coupling between the source degeneration inductances.

In block 906, the negative inductive (−K) coupling between the source degeneration inductances is used to cancel the positive inductive (+K) coupling-induced noise in the LNA.

The area-efficient degenerative inductance for a low noise amplifier (LNA) described herein may be implemented on one or more ICs, analog ICs, RFICs, mixed-signal ICs, ASICs, printed circuit boards (PCBs), electronic devices, etc. The area-efficient degenerative inductance for a low noise amplifier LNA circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the area-efficient degenerative inductance for an LNA described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
   a first and a second low noise amplifier (LNA);
   a first degenerative inductance coupled between the first LNA and ground; and
   a second degenerative inductance coupled between the second LNA and ground, the first and second degenerative inductances configured to establish negative inductive coupling.

2. The device of claim 1, wherein the first and second LNAs are configured to operate on a radio frequency signal having two frequencies in the same communication band.

3. The device of claim 1, wherein the first and second LNAs are configured to operate on a radio frequency signal having two frequencies in different communication bands.

4. The device of claim 1, wherein the first and second degenerative inductances are configured as a switchless, four port circuit.

5. The device of claim 1, wherein the first and second degenerative inductances are concentrically wound and interwoven, the first degenerative inductance configured to have a first current flow direction, the second degenerative inductance configured to have a second current flow direction, such that the first current flow direction is opposite the second current flow direction.

6. The device of claim 1, wherein the first and second degenerative inductances are concentrically wound, the first degenerative inductance being located substantially within an area occupied by the second degenerative inductance, the first degenerative inductance configured to have a first current flow direction, the second degenerative inductance configured to have a second current flow direction, such that the first current flow direction is opposite the second current flow direction.

7. A method comprising:
   amplifying a first carrier using a first low noise amplifier (LNA) and a second carrier using a second LNA;
   coupling a first degenerative inductance between the first LNA and ground;
   coupling a second degenerative inductance between the second LNA and ground; and
   establishing a negative inductive coupling factor between the first and second degenerative inductances.

8. The method of claim 7, wherein the first carrier and the second carrier are in the same communication band.

9. The method of claim 7, wherein the first carrier and the second carrier are in different communication bands.

10. The method of claim 7, further comprising configuring the first and second degenerative inductances as a switchless, four port circuit.

11. The method of claim 7, further comprising concentrically winding and interweaving the first and second degenerative inductances, the first degenerative inductance configured to have a first current flow direction, the second degenerative inductance configured to have a second current flow direction, such that the first current flow direction is opposite the second current flow direction.

12. The method of claim 7, further comprising:
    concentrically winding the first and second degenerative inductances; and
    locating the first degenerative inductance substantially within an area occupied by the second degenerative inductance, the first degenerative inductance configured to have a first current flow direction, the second degenerative inductance configured to have a second current flow direction, such that the first current flow direction is opposite the second current flow direction.

13. The method of claim 7, further comprising using the negative inductive coupling factor between the first and second degenerative inductances to compensate for a positive coupling factor between a first ground connection associated with the first LNA and a second ground connection associated with the second LNA.

14. A device, comprising:
    first means for amplifying a first carrier signal;
    second means for amplifying a second carrier signal;
    means for a first degenerative inductance coupling between the first means for amplifying and a ground;
    means for a second degenerative inductance coupling between the second means for amplifying and the ground; and
    means for establishing a negative coupling factor between the first and second degenerative inductance couplings.

15. The device of claim 14, wherein the first and second means for amplifying comprise means for amplifying a radio frequency signal having two frequencies in the same communication band.

16. The device of claim 14, wherein the first and second means for amplifying comprise means for amplifying a radio frequency signal having two frequencies in different communication bands.

17. The device of claim 14, further comprising means for configuring the first and second degenerative inductance couplings as a switchless, four port circuit.

18. The device of claim 14, further comprising means for concentrically winding and interweaving the first and second degenerative inductance couplings, the first degenerative inductance coupling configured to have a first current flow direction, the second degenerative inductance coupling configured to have a second current flow direction, such that the first current flow direction is opposite the second current flow direction.

19. The device of claim 14, further comprising:
    means for concentrically winding the first and second degenerative inductance couplings; and
    means for locating the first degenerative inductance coupling substantially within an area occupied by the second degenerative inductance coupling, the first degenerative inductance coupling configured to have a first current flow direction, the second degenerative inductance coupling configured to have a second current flow direction, such that the first current flow direction is opposite the second current flow direction.

20. The device of claim 14, further comprising means for compensating for a positive coupling factor between a first ground connection associated with the first means for amplifying and a second ground connection associated with the second means for amplifying.

* * * * *